(12) United States Patent
Kim et al.

(10) Patent No.: US 12,213,347 B2
(45) Date of Patent: Jan. 28, 2025

(54) DISPLAY PANEL

(71) Applicant: Samsung Display Co., Ltd., Yongin-Si (KR)

(72) Inventors: Yujin Kim, Hwaseong-si (KR); Dasom Kang, Asan-si (KR); Shin Tack Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 17/574,729

(22) Filed: Jan. 13, 2022

(65) Prior Publication Data

US 2022/0328581 A1 Oct. 13, 2022

(30) Foreign Application Priority Data

Apr. 9, 2021 (KR) ........................ 10-2021-0046747

(51) Int. Cl.
*H01L 27/32* (2006.01)
*H01L 51/50* (2006.01)
*H01L 51/52* (2006.01)
*H10K 50/115* (2023.01)
*H10K 50/844* (2023.01)
(Continued)

(52) U.S. Cl.
CPC ......... *H10K 59/122* (2023.02); *H10K 50/115* (2023.02); *H10K 50/844* (2023.02); *H10K 59/38* (2023.02)

(58) Field of Classification Search
CPC .. H10K 59/122; H10K 50/115; H10K 50/844; H10K 59/38; H10K 59/12; H10K 59/8731; H10K 59/88; H10K 50/125

USPC .......................................................... 257/40
See application file for complete search history.

(56) References Cited

U.S. PATENT DOCUMENTS 7,667,397 B2 2/2010 Oh et al.
10,854,694 B2 12/2020 Myung et al.
2018/0182816 A1 6/2018 Kang et al.
(Continued)

FOREIGN PATENT DOCUMENTS

EP 3706184 9/2020
EP 4002473 5/2022
(Continued)

*Primary Examiner* — Tong-Ho Kim
(74) *Attorney, Agent, or Firm* — F. CHAU & ASSOCIATES, LLC (57) ABSTRACT

A display panel including: a display region including pixels and a non-display region, each pixel including an emission element including a first electrode, an emission layer, and a second electrode; a pixel definition layer including a first opening; a first encapsulation layer on the pixel definition layer and overlapping the emission element; a partition wall on the first encapsulation layer and including a second opening and a dummy opening; a light control pattern in the second opening; a second encapsulation layer on the partition wall and overlapping the light control pattern; and a color filter on the second encapsulation layer and overlapping the light control pattern, the second encapsulation layer includes: a first encapsulation inorganic layer on the partition wall; an encapsulation organic layer on the first encapsulation inorganic layer and including an edge overlapping the dummy opening; and a second encapsulation inorganic layer on the encapsulation organic layer.

23 Claims, 8 Drawing Sheets

(51) Int. Cl.
*H10K 59/122* (2023.01)
*H10K 59/38* (2023.01)

(56) References Cited

U.S. PATENT DOCUMENTS

2020/0152705 A1* 5/2020 Son .................. H10K 59/35
2020/0258944 A1   8/2020 Joo et al.

FOREIGN PATENT DOCUMENTS

| KR | 10-0647339 | 11/2006 |
| KR | 10-2019-0073773 | 6/2019 |
| KR | 10-2020-0075607 | 6/2020 |

* cited by examiner

DISPLAY PANEL

CROSS-REFERENCE TO RELATED APPLICATION

This U.S. non-provisional patent application claims priority under 35 U.S.C. § 119 to Korean Patent Application No. 10-2021-0046747, filed on Apr. 9, 2021, in the Korean Intellectual Property Office, the disclosure of which is incorporated by reference herein in its entirety.

TECHNICAL FIELD

The present disclosure relates to a display panel, and in particular, to a display panel including a light control pattern.

DISCUSSION OF RELATED ART

Display panels may be classified as a transmission-type display panel and an emission-type display panel. A transmission-type display panel uses a separate light source to produce a visible image. An emission-type display panel does not require a separate light source to produce a visible image. In general, to produce a color image, the display panel includes three or more different kinds of light control patterns. The light control pattern may be transparent to only the source light in a specific wavelength range or may convert the color of the source light. Some light control patterns may change the optical characteristics of the source light, but not the color of the source light.

SUMMARY

An embodiment of the inventive concept provides a display panel with increased display quality.

According to an embodiment of the inventive concept, a display panel may include: a display region including pixels and a non-display region adjacent to the display region, wherein each pixel includes an emission element, the emission element including a first electrode, an emission layer disposed on the first electrode, and a second electrode disposed on the emission layer; a pixel definition layer including a first opening that exposes the first electrode of the emission element; a first encapsulation layer disposed on the pixel definition layer and overlapping the emission element; a partition wall disposed on the first encapsulation layer and including a second opening corresponding to the first opening and a dummy opening overlapping the non-display region; a light control pattern disposed in the second opening; a second encapsulation layer disposed on the partition wall and overlapping the light control pattern; and a color filter disposed on the second encapsulation layer and overlapping the light control pattern, wherein the second encapsulation layer includes: a first encapsulation inorganic layer disposed on the partition wall; an encapsulation organic layer disposed on the first encapsulation inorganic layer and including an edge overlapping the dummy opening; and a second encapsulation inorganic layer disposed on the encapsulation organic layer.

The display panel may further include a dummy control pattern disposed in the dummy opening.

The dummy control pattern may include the same material as the light control pattern.

The light control pattern may include a quantum dot.

The emission element may include a first emission element, a second emission element, and a third emission element for generating a source light, and the emission layer of the first emission element, the emission layer of the second emission element, and the emission layer of the third emission element are in the form of a single body.

The partition wall may overlap the display region and the non-display region, and the first and second encapsulation inorganic layers may be disposed on a top surface of the partition wall in the non-display region.

At least one of the first and second encapsulation inorganic layers may be disposed on a side surface of the partition wall in the non-display region.

The display panel may further include an inorganic layer disposed below the emission element, wherein the at least one of the first and second encapsulation inorganic layers may be in contact with the inorganic layer in the non-display region.

The second opening and the dummy opening may have substantially the same area.

The dummy opening may be provided in plural, and the plurality of dummy openings may enclose the display region when viewed in a plan view.

A difference in height between a top surface of the partition wall and a top surface of the light control pattern may be about 2 μm to about 3 μm.

The emission element may include a first emission element, a second emission element, and a third emission element for generating a source light, the light control pattern may include a first color conversion pattern for converting the source light to a first color light, a second color conversion pattern for converting the source light to a second color light, and a transmission pattern transparent to the source light, the color filter may include a first color filter corresponding to the first color conversion pattern, a second color filter corresponding to the second color conversion pattern, and a third color filter corresponding to the transmission pattern, and at least two of the first color filter, the second color filter, and the third color filter may be disposed on the second encapsulation layer and in the non-display region.

The dummy opening may overlap the pixel definition layer.

The display panel may further include a dam line, which is disposed away from the pixel definition layer and overlaps the non-display region when viewed in a plan view, the first encapsulation layer may include: a first encapsulation inorganic layer overlapping the dam line; an encapsulation organic layer disposed on the first encapsulation inorganic layer of the first encapsulation layer and including an edge disposed inside the dam line; and a second encapsulation inorganic layer disposed on the encapsulation organic layer of the first encapsulation layer and overlapping the dam line.

The dam line may have a closed-line shape when viewed in a plan view.

The display panel may further include a protection layer overlapping the display region and the non-display region and disposed on the color filter.

The first encapsulation inorganic layer may include a silicon oxynitride layer and a silicon oxide layer disposed on the silicon oxynitride layer.

According to an embodiment of the inventive concept, a display panel may include: a display region including pixels and a non-display region adjacent to the display region, wherein each of the pixels includes an emission element disposed on the inorganic layer, wherein the emission element includes a first electrode, an emission layer disposed on the first electrode, and a second electrode disposed on the emission layer; an inorganic layer overlapping the display region and the non-display region; a pixel definition layer including a first opening that exposes the first electrode of the emission element; a first encapsulation layer disposed on the pixel definition layer and overlapping the emission elements; a partition wall disposed on the first encapsulation layer and including a second opening corresponding to the first opening; a light control pattern disposed in the second opening; a second encapsulation layer disposed on the partition wall and overlapping the light control pattern, and a color filter disposed on the second encapsulation layer and overlapping the light control pattern, wherein the second encapsulation layer includes: a first encapsulation inorganic layer disposed on the partition wall; an encapsulation organic layer disposed on the first encapsulation inorganic layer; and a second encapsulation inorganic layer disposed on the encapsulation organic layer, wherein at least one of the first and second encapsulation inorganic layers may be disposed in the non-display region and on a top surface and a side surface of the partition wall.

The at least one of the first and second encapsulation inorganic layers may be in contact with the inorganic layer in the non-display region.

The emission element may include a first emission element, a second emission element, and a third emission element for generating a source light, the light control pattern may include a first color conversion pattern for converting the source light to a first color light, a second color conversion pattern for converting the source light to a second color light, and a transmission pattern transparent to the source light, the color filter may include a first color filter corresponding to the first color conversion pattern, a second color filter corresponding to the second color conversion pattern, and a third color filter corresponding to the transmission pattern, and at least two of the first color filter, the second color filter, and the third color filter may be disposed in the non-display region and on the second encapsulation layer.

According to an embodiment of the inventive concept, a display panel may include: a display region including emission elements and a non-display region adjacent to the display region; a pixel definition layer; a first encapsulation layer disposed on the pixel definition layer and overlapping the emission elements; a partition wall disposed on the first encapsulation layer and including a second opening overlapping the first opening and first and second dummy openings overlapping the pixel definition layer in the non-display region; a light control pattern disposed in the second opening; and a second encapsulation layer disposed on the partition wall and overlapping the light control pattern and the first and second dummy openings, wherein the second encapsulation layer includes: an organic layer ending at the second dummy opening.

The display panel may include a dummy control pattern provided in each of the first and second dummy openings.

The second encapsulation layer may further include first and second inorganic layers extending beyond the second dummy opening to overlap a portion of the partition wall covering a dam.

BRIEF DESCRIPTION OF THE DRAWINGS

Example embodiments of the inventive concept will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment. In addition, these drawings should not be interpreted as defining or limiting the range of values or properties encompassed by the example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments of the inventive concept will now be described more fully with reference to the accompanying drawings. Example embodiments of the inventive concept may, however, be embodied in many different forms and should not be construed as being limited to the embodiments set forth herein. For example, these embodiments are provided so that this disclosure will be thorough and complete, and will fully convey the concept of example embodiments to those of ordinary skill in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1A:
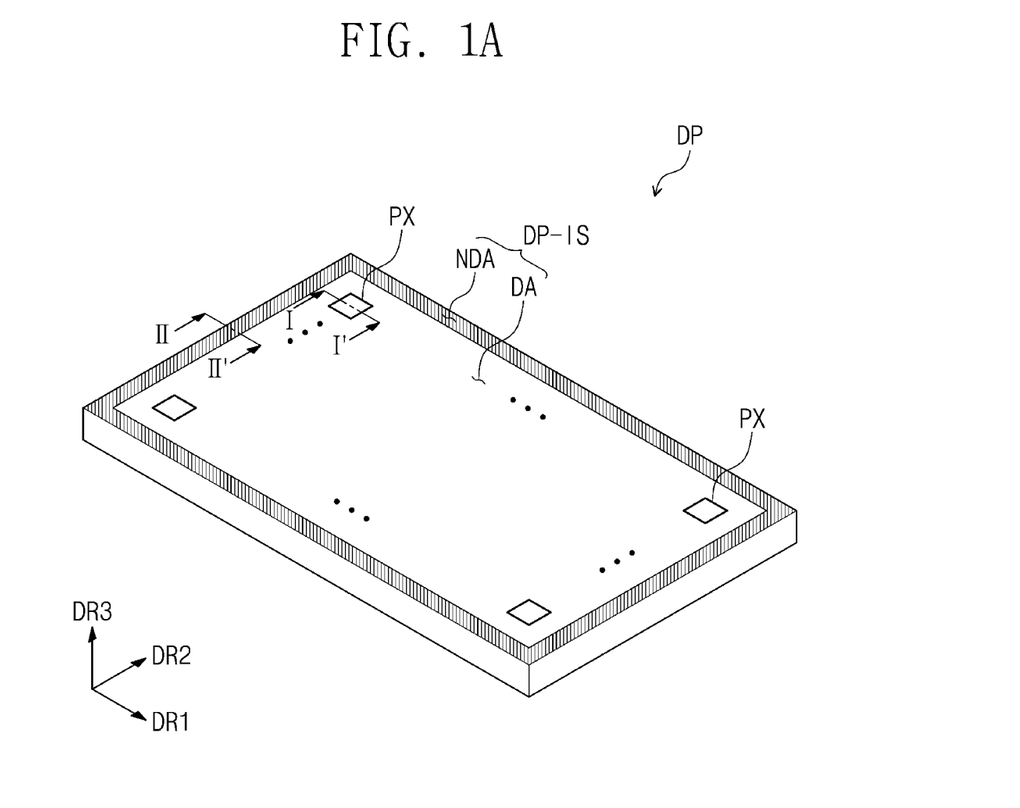
FIG. 1A is a perspective view illustrating a display panel according to an embodiment of the inventive concept.
Figure 1B:
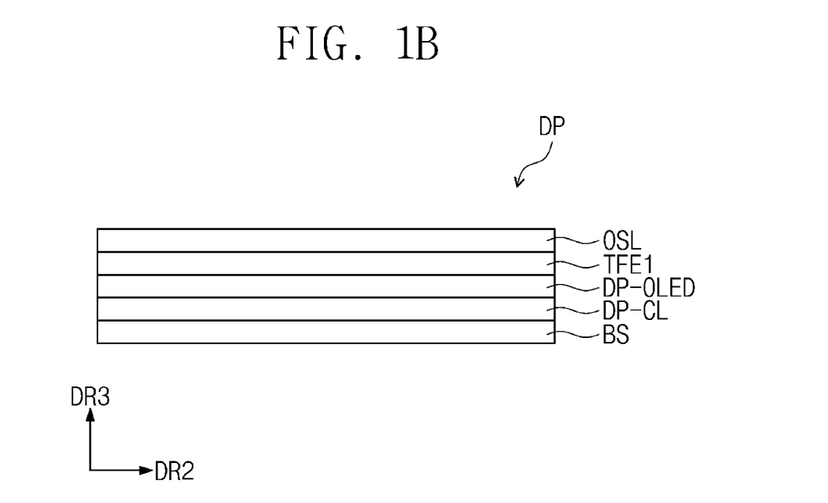
FIG. 1B is a sectional view illustrating a display panel according to an embodiment of the inventive concept.

FIG. 1A is a perspective view illustrating a display panel DP according to an embodiment of the inventive concept. FIG. 1B is a sectional view illustrating the display panel DP according to an embodiment of the inventive concept.

The display panel DP shown in FIGS. 1A and 1B may be a light-emitting type display panel, and in an embodiment, the display panel DP may be one of an inorganic light emitting display panel or an organic light emitting display panel. However, the inventive concept is not limited thereto.

As shown in FIG. 1A, the display panel DP may include a display surface DP-IS, which is used to display an image. The display surface DP-IS may be parallel to a plane formed by a first direction axis DR1 and a second direction axis DR2. The display surface DP-IS may form a front surface of the display panel DP.

A top surface of the topmost one of components constituting the display panel DP may be referred to as the display surface DP-IS. For example, a top surface of an optical control layer OSL shown in FIG. 1B may be referred to as the display surface DP-IS of FIG. 1A. A normal direction of the display surface DP-IS (e.g., a thickness direction of the display panel DP) will be referred to as a third direction axis DR3. In the following description, the third direction axis DR3 may be used to differentiate a front or top surface of each element (e.g., a layer or a unit) from a back or bottom surface. However, directions indicated by the first to third direction axes DR1, DR2, and DR3 may be just an example. Hereinafter, first to third directions may be referred to as directions that are indicated by the first to third direction axes DR1, DR2, and DR3, respectively, and will be identified with the same reference numbers.

The display panel DP may include a display region DA and a non-display region NDA. A pixel PX may be disposed in the display region DA but not in the non-display region NDA. The non-display region NDA may be provided along an edge of the display surface DP-IS. The non-display region NDA may enclose the display region DA. In other words, the non-display region NDA may surround four sides of the display region DA. In an embodiment, the non-display region NDA may be omitted or may be locally disposed near only one side portion of the display region DA.

In an embodiment, the display panel DP is illustrated to have a flat-type display surface DP-IS, but the inventive concept is not limited to this example. The display panel DP may include a curved or three-dimensional display surface. The three-dimensional display surface may include a plurality of display regions, which are oriented in different directions.

In an embodiment, the display panel DP may be a rollable display panel, a foldable display panel, or a slidable display panel. The display panel DP may have a flexible property and may be provided as a folded or rolled component in a display device.

As shown in FIG. 1B, the display panel DP may include a base substrate BS and a circuit element layer DP-CL, a display element layer DP-OLED, a first encapsulation layer TFE1, and the optical control layer OSL, which are disposed on the base substrate BS. The base substrate BS and the circuit element layer DP-CL, the display element layer DP-OLED, the first encapsulation layer TFE1, and the optical control layer OSL may be arranged in sequence. The base substrate BS may include a glass substrate, a plastic substrate, or a composite substrate made of organic and inorganic materials. The circuit element layer DP-CL may include a driving circuit of the pixel PX or a signal line. The display element layer DP-OLED may include an emission element disposed in each pixel PX. The first encapsulation layer TFE1 may include at least one inorganic layer, which is provided to hermetically seal or encapsulate the emission element. The optical control layer OSL may be configured to convert optical characteristics of a source light generated by the emission element. Hereinafter, the display panel DP will be described in more detail with reference to FIGS. 2A and 2B.

Figure 2A:
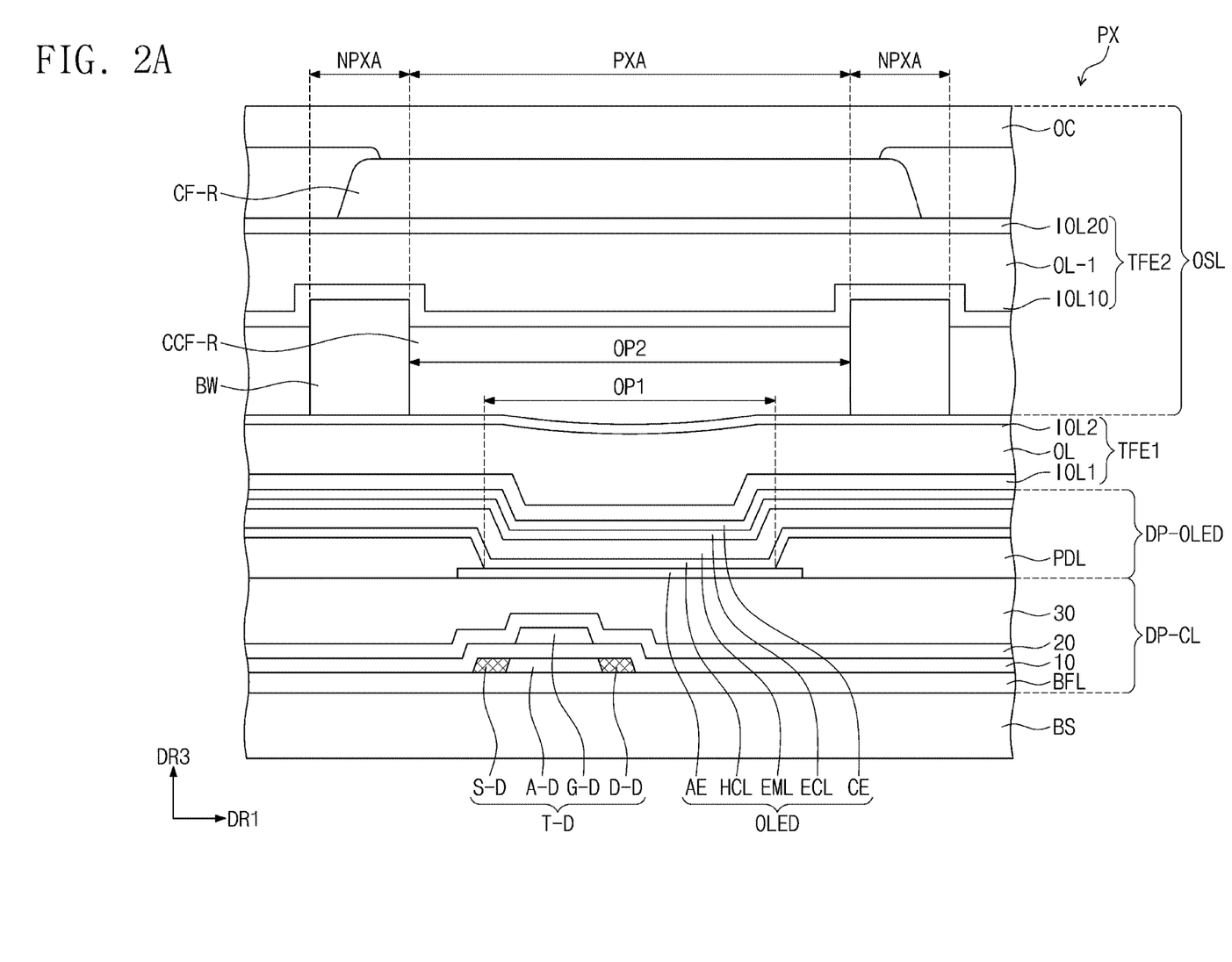
FIG. 2A is a sectional view taken along line I-I' of FIG. 1A.
Figure 2B:
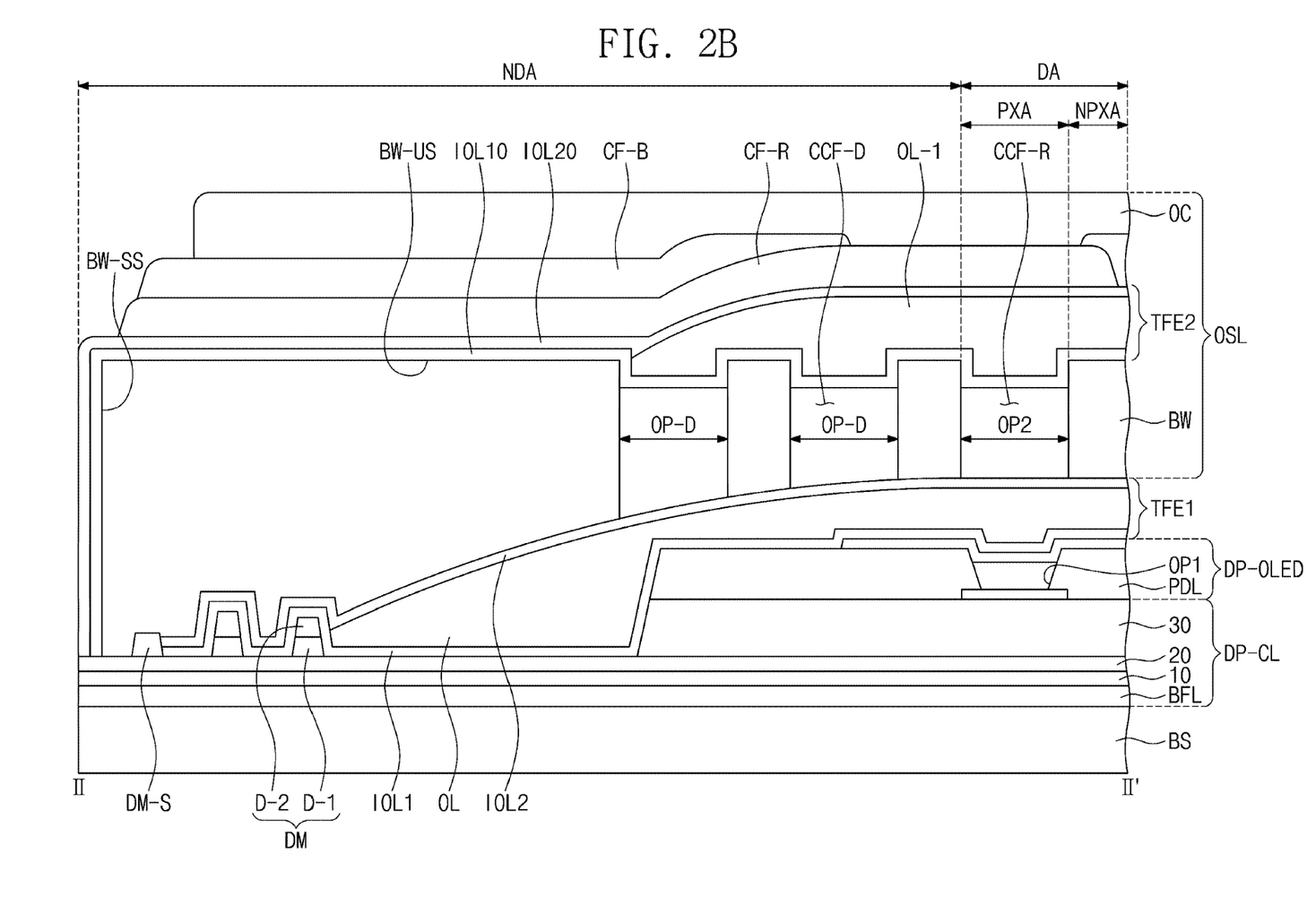
FIG. 2B is a sectional view taken along line II-II' of FIG. 1A.
Figure 2C:
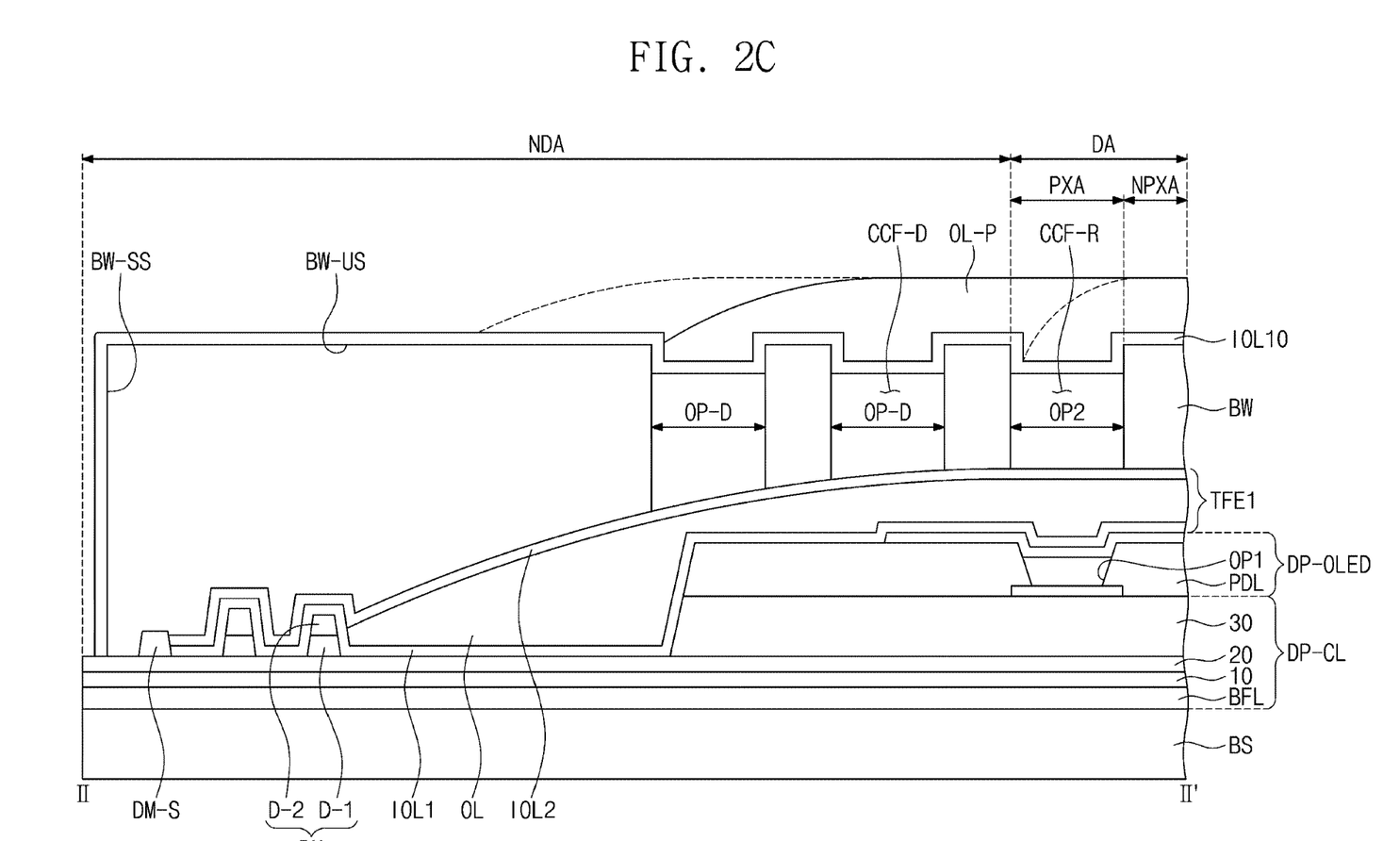
FIG. 2C is a sectional view illustrating a step of a process of fabricating a display panel.

FIG. 2A is a sectional view taken along line I-I' of FIG. 1A. FIG. 2B is a sectional view taken along line II-II' of FIG. 1A. FIG. 2C is a sectional view illustrating a step of a process of fabricating the display panel DP. FIG. 2A illustrates a section corresponding to the pixel PX, and FIG. 2B illustrates a section corresponding to the non-display region NDA of the display panel DP. In FIG. 2B, an emission element OLED is illustrated in a simplified manner.

Referring to FIG. 2A, the display region DA may include a pixel region PXA and a peripheral region NPXA. The pixel region PXA may be disposed in each of a plurality of pixels PX shown in FIG. 1A. The peripheral region NPXA may delimit the plurality of pixel regions PXA and may prevent color-mixing from occurring in adjacent pixel regions PXA. In the present embodiment, the pixel region PXA may correspond to a second opening OP2, which will be described below. The peripheral region NPXA may be a region, in which a partition wall BW is disposed.

The pixel regions PXA may include a first pixel region providing a first color light (e.g., red light), a second pixel region providing a second color light (e.g., green light), and a third pixel region providing a third color light (e.g., blue light). The red, green, and blue colors may be replaced by another set of primary colors, but the inventive concept is not limited to this example. The description that follows will refer to an example in which the pixel region PXA of FIG. 2A is the first pixel region providing the red light.

The first pixel region, the second pixel region, and the third pixel region may have substantially the same sectional structure, and thus, the first pixel region will be mainly described below. Differences between the first, second, and third pixel regions will be more clearly described below, and except for the differences, the first, second, and third pixel regions may be interpreted as having substantially the same structure.

The first, second, and third pixel regions may have the same area or different areas and the inventive concept is not limited to the areas of the first, second, and third pixel regions. The first, second, and third pixel regions may be arranged in a stripe shape or in a pentile shape, but the inventive concept is not limited to this example.

In the display region DA shown in FIG. 1A, the first, second, and third pixel regions may be arranged in a specific rule. The minimum repetition unit of the first, second, and third pixel regions may be a unit pixel. In an embodiment, the unit pixel may be a region, in which one first pixel region, one second pixel region, and one third pixel region are disposed. In an embodiment, the unit pixel may include one first pixel region, two second pixel regions, and one third pixel region.

A portion of the pixel PX, in which a driving transistor T-D and an emission element OLED are provided, may have a sectional structure as illustrated in FIG. 2A. The display panel DP may include a plurality of insulating layers, a plurality of semiconductor patterns, a plurality of conductive patterns, and a plurality of signal lines. For example, an insulating layer, a semiconductor layer, and a conductive layer may be formed through a coating or deposition process. Thereafter, the insulating layer, the semiconductor layer, and the conductive layer may be selectively patterned by a photolithography and etching process. This method may be used to form the semiconductor patterns, the conductive patterns, and the signal lines constituting the circuit element layer DP-CL and the display element layer DP-OLED.

In the present embodiment, the circuit element layer DP-CL may include a buffer layer BFL, a first insulating layer 10, a second insulating layer 20, and a third insulating layer 30. For example, the buffer layer BFL, the first insulating layer 10, and the second insulating layer 20 may be inorganic layers, and the third insulating layer 30 may be an organic layer.

FIG. 2A illustrates an example arrangement of an active A-D, a source S-D, a drain D-D, and a gate G-D constituting the driving transistor T-D. The active A-D, the source S-D, and the drain D-D may be portions of a semiconductor pattern that are distinguished according to their doping concentrations or conductivity types. The active A-D may be referred to as an active region, the source S-D may be referred to as a source region or a source electrode, the drain D-D may be referred to as a drain region or a drain electrode and the gate G-D may be referred to as a gate electrode.

The display element layer DP-OLED may include the emission element OLED. The emission element OLED may generate a source light. The emission element OLED may include a first electrode, a second electrode, and an emission layer therebetween. In the present embodiment, the display element layer DP-OLED may include an organic light emitting diode serving as its emission element. The display element layer DP-OLED may include a pixel definition layer PDL. For example, the pixel definition layer PDL may be an organic layer. The pixel definition layer PDL may include a black coloring agent. The pixel definition layer PDL may include a base resin and a black dye or black pigment, which is mixed in the base resin. In an embodiment, the black coloring agent may contain a carbon black or may include at least one of metallic materials (e.g., chromium) or oxides thereof.

A first electrode AE of the emission element OLED may be disposed on the third insulating layer 30. The first electrode AE may be directly or indirectly connected to the driving transistor T-D. The first electrode AE may overlap the driving transistor T-D. A first opening OP1 may be provided in the pixel definition layer PDL. The first opening OP1 may expose at least a portion of the first electrode AE.

A hole control layer HCL, an emission layer EML, an electron control layer ECL of the emission element OLED may be disposed in both of the pixel region PXA and the peripheral region NPXA. The hole control layer HCL, the emission layer EML, and the electron control layer ECL may be commonly disposed in a plurality of pixel regions. The emission layer EML in the pixel regions may be provided in the form of a single body. The emission layers in the first, second, and third pixel regions may be provided in the form of a single emission layer and may emit a source light of the same color, regardless of their regions.

The hole control layer HCL may include a hole transport layer and, in an embodiment, the hole control layer HCL may further include a hole injection layer. The emission layer EML may generate a blue light as the source light. The blue light may have a wavelength ranging from 410 nm to 480 nm. The blue light may have a light spectrum whose peak wavelength is within the range from 440 nm to 460 nm. The electron control layer ECL may include an electron transport layer, and in an embodiment, the electron control layer ECL may further include an electron injection layer. A second electrode CE may be disposed on the electron control layer ECL. For example, the second electrode CE may be in direct contact with the electron control layer ECL. The second electrode CE may be commonly disposed in a plurality of pixel regions. The second electrode CE, which is provided in the form of a single body, may be disposed in the plurality of pixel regions.

The first encapsulation layer TFE1 may be disposed on the second electrode CE to hermetically seal or encapsulate the emission element OLED. The first encapsulation layer TFE1 may include at least one inorganic layer. For example, the first encapsulation layer TFE1 may include a multi-layered structure, in which inorganic and organic layers are repeatedly stacked. In the present embodiment, the first encapsulation layer TFE1 may include a first encapsulation inorganic layer IOL1, an encapsulation organic layer OL, and a second encapsulation inorganic layer IOL2. The first and second encapsulation inorganic layer IOL1/IOL2 may protect the emission element OLED from external moisture, and the encapsulation organic layer OL may prevent an imprinting failure from occurring in the emission element OLED due to an external contaminant during the fabrication process. The display panel DP may further include a refractive index control layer, which is configured to improve the upward emission efficiency of the first encapsulation layer TFE1.

As shown in FIG. 2A, the optical control layer OSL may be disposed on the first encapsulation layer TFE1. For example, the optical control layer OSL may be disposed on the second encapsulation inorganic layer IOL2. The optical control layer OSL may include the partition wall BW, a light control pattern CCF-R, a second encapsulation layer TFE2, a color filter CF-R, and a protection layer OC.

The partition wall BW may include a base resin having a highly transparent property and an additive agent. The base resin may be formed of various resin composites which may be called "binders". The additive agent may include a coupling agent and/or a photo-initiator. The additive agent may further include a dispersing agent.

The partition wall BW may include a black coloring agent having a light blocking property. The partition wall BW may include a base resin and a black dye or black pigment mixed in the base resin. In an embodiment, the black coloring agent may contain a carbon black or may contain at least one of metallic materials (e.g., chromium) or oxides thereof.

The partition wall BW may include the second opening OP2 corresponding to the first opening OP1. When viewed in a plan view, the second opening OP2 may be overlapped with the first opening OP1 and may have an area larger than the first opening OP1. When viewed in the cross-sectional view, the second opening OP2 may be wider than the first opening OP1.

The light control pattern CCF-R may be disposed in the second opening OP2. The light control pattern CCF-R may change optical characteristics of the source light. For example, the light control pattern CCF-R may change optical characteristics of light emitted from the emission element OLED. The light control pattern CCF-R of the first and second pixel regions may be a color conversion pattern capable of changing the color of the source light. When the source light is a blue light, the color conversion pattern of the first pixel region may convert the source light to a red light, and the color conversion pattern of the second pixel region may convert the source light to a green light. The light control pattern CCF-R of the third pixel region may be a transmission pattern. The light control pattern CCF-R of the third pixel region may include scattering particles, and in this case, the source or blue light, which is incident into the third pixel region, may be scattered by the light control pattern CCF-R and may be emitted to the outside of the third pixel region.

The color conversion pattern may include a base resin and quantum dots, which are mixed or dispersed in the base resin. In the present embodiment, the color conversion pattern may include a quantum dot, and in this sense, the color conversion pattern may be referred to as a quantum dot pattern. The color conversion patterns of the first and second pixel regions may include different quantum dots from each other. The base resin may be a medium material, in which the quantum dots are dispersed, and may be formed of at least one of various resin composites, which may be called "binders". However, the inventive concept is not limited to this example, and in the present specification, if the quantum dots can be dispersed in a medium material, the medium material may be referred to as a base resin, regardless of its name, additional function, or constituents. The base resin may be a polymer resin. For example, the base resin may be acrylic resins, urethane resins, silicone resins, and/or epoxy resins. The base resin may be transparent.

The color conversion pattern may include a base resin and a scattering particle mixed in the base resin, like the transmission pattern. The scattering particle may be a nano particle that is formed of or includes titanium oxide ($TiO_2$) or silica.

Quantum dots may be particles that cause a change in the wavelength of incident light. Each of the quantum dots may have a nanometer-order crystalline material consisting of hundreds to thousands of atoms and may exhibit an increase in band gap, due to its small size and the consequent quantum confinement effect. In the case where the energy of light incident to the quantum dots is larger than a band gap of the quantum dots, each of the quantum dots may absorb the light to enter an excited state, and then, may emit light of a specific wavelength to return to its ground state. The light emitted from the quantum dots may have an energy corresponding to the band gap. In other words, by adjusting sizes or compositions of the quantum dots, it is possible to control the quantum confinement effect and the light-emitting characteristics of the optical conversion pattern.

The quantum dot may be selected from the group consisting of II-VI compounds, I-III-VI compounds, III-V compounds, IV-VI compounds, IV elements, IV compounds, and combination thereof.

The II-VI compounds may be selected from the group consisting of binary compounds (e.g., including CdSe, CdTe, CdS, ZnS, ZnSe, ZnTe, ZnO, HgS, HgSe, HgTe, MgSe, and MgS), mixtures of the binary compounds, ternary compounds (e.g., including AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), mixtures of the ternary compounds, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and mixtures of the quaternary compounds.

The I-III-VI compounds may be selected from the group consisting of ternary compounds (e.g., including AgInS2, CuInS2, AgGaS2, and CuGaS2), mixtures of the ternary compounds, quaternary compounds (e.g., including AgInGaS2 and CuInGaS2), and mixtures of the quaternary compounds.

The III-V compounds may be selected from the group consisting of binary compounds (e.g., including GaN, GaP, GaAs, GaSb, AlN, AlP, AlAs, AlSb, InN, InP, InAs, and InSb), mixtures of the binary compounds, ternary compounds (e.g., including GaNP, GaNAs, GaNSb, GaPAs, GaPSb, AlNP, AlNAs, AlNSb, AlPAs, AlPSb, InGaP, InAlP, InNP, InNAs, InNSb, InPAs, and InPSb), mixtures of the ternary compounds, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and mixtures of the quaternary compounds. In an embodiment, the III-V compounds may further include one of the group II metals. For example, InZnP or the like may be selected as such a III-II-V compound.

The IV-VI compounds may be selected from the group consisting of binary compounds (e.g., including SnS, SnSe, SnTe, PbS, PbSe, and PbTe), mixtures of the binary compounds, ternary compounds (e.g., including SnSeS, SnSeTe, SnSTe, PbSeS, PbSeTe, PbSTe, SnPbS, SnPbSe, and SnPbTe), mixtures of the ternary compounds, quaternary compounds (e.g., including SnPbSSe, SnPbSeTe, and SnPbSTe), and mixtures of the quaternary compounds. The IV elements may be selected from the group consisting of Si, Ge, and combination thereof. The IV compounds may include binary compounds selected from the group consisting of SiC, SiGe, and combination thereof.

Here, in each particle, the binary, ternary, or quaternary compound may be provided to have a uniform concentration throughout the particle or to have a varying concentration distribution or spatially divided concentration states.

The quantum dots may be a core-shell structure including a core and a shell enclosing the core. In an embodiment, the quantum dots may have a core/shell structure, in which one quantum dot is enclosed by another quantum dot. At an interface between the core and the shell, an element contained in the shell may have a concentration gradient decreasing in a central direction.

Each of the quantum dots may be a nanometer-scale particle. Each of the quantum dots may have a light-emitting wavelength spectrum whose full-width-at-half-maximum (FWHM) is less than about 45 nm (in particular, less than about 40 nm or in more particular, less than about 30 nm), and in this case, it is possible to improve color purity or color reproduction characteristics. Furthermore, since the quantum dots emit light radially, it is possible to improve a viewing angle property.

In an embodiment, the quantum dots may be a spherical, pyramid-shaped, multi-arm, or cubic nano particle. In another embodiment, the quantum dots may be a nano tube, a nano wire, a nano fiber, a nano plate-shaped particle, but the shape of the quantum dots is not limited to these examples. A wavelength or color of light emitted from the quantum dot may be determined by a particle size of the quantum dot, and thus, in the case where the quantum dots are provided in various sizes, lights converted by the quantum dots may have various colors (e.g., red, green, and blue).

In the present embodiment, the light control pattern CCF-R may be formed by an inkjet process. A liquid composite may be provided in the second opening OP2. A composite material, which is polymerized by a thermal curing process or optical curing process, may have a reduced volume after the curing process.

There may be a difference in height between a top surface of the partition wall BW and a top surface of the light control pattern CCF-R. In other words, the top surface of the partition wall BW may be higher than the top surface of the light control pattern CCF-R. The difference in height between the top surface of the partition wall BW and the top surface of the light control pattern CCF-R may range from about 2 μm to about 3 μm.

The second encapsulation layer TFE2 may be disposed on the partition wall BW to be overlapped with the light control pattern CCF-R. The second encapsulation layer TFE2 may include a first encapsulation inorganic layer IOL10, an encapsulation organic layer OL-A, and a second encapsulation inorganic layer IOL20. Each of the first encapsulation inorganic layer IOL10, the encapsulation organic layer OL-1, and the second encapsulation inorganic layer IOL20 may be provided in the second opening OP2. The first and second encapsulation inorganic layers IOL10 and IOL20 may protect the light control pattern CCF-R from external moisture, and the encapsulation organic layer OL-1 may remove an uneven profile that is formed by a difference in height between the partition wall BW and the light control pattern CCF-R and may provide a flat base surface to an element to be disposed thereon.

Each of the first and second encapsulation inorganic layers IOL10 and IOL20 may be formed of or include at least one of silicon oxide, silicon oxynitride, or silicon nitride. The encapsulation organic layer OL-1 may be formed of or include an organic material (e.g., acrylic organic materials).

The color filter CF-R may be disposed on the second encapsulation layer TFE2. The color filter CF-R may be transparent to light in a specific wavelength range and may block light whose wavelength is not within the wavelength range. The color filter CF-R of the first pixel region may be transparent to a red light that passes therethrough and may block green and blue lights.

The color filter CF-R may include a base resin and a dye and/or pigment dispersed in the base resin. The base resin may be a medium material, in which the dye and/or pigment is dispersed, and may be made of at least one of various resin composites, which may be called "binders".

Since the encapsulation organic layer OL-1 removes the difference in height between the underlying patterns, the color filter CF-R may be formed on a flat surface and may have a uniform thickness in the pixel region PXA. A red light generated in the light control pattern CCF-R may be emitted to the outside of the pixel region PXA with a uniform brightness.

The protection layer OC may be disposed on the color filter CF-R. The protection layer OC may be an organic layer which is used to protect the color filter CF-R. The protection layer OC may be formed of or include an optically- or thermally-curable organic material.

In an embodiment, a glass substrate may be further disposed on the protection layer OC. The glass substrate may protect the underlying layers of the display panel DP. An adhesive layer may be disposed between the protection layer OC and the glass substrate. In an embodiment, the protection layer OC may be formed of or include an inorganic material.

Referring to FIG. 2B, the display panel DP may include a dam line DM, which is disposed outside the pixel definition layer PDL and is overlapped with the non-display region NDA. FIG. 2B illustrates an example, in which two dam lines DM are provided, but the inventive concept is not limited to the specific number of the dam lines DM. In an embodiment, the dam line DM may be omitted.

The dam line DM may delimit a region, which is occupied by a liquid composite during a process of fabricating the encapsulation organic layer OL of the first encapsulation layer TFE1, within the border of the base substrate BS. In other words, a position of an edge of the encapsulation organic layer OL of the first encapsulation layer TFE1 may be limited to a region inside the dam line DM, e.g., in the right portion of FIG. 2B. For example, the encapsulation organic layer OL of the first encapsulation layer TFE1 may end at the dam line DM. The dam line DM may include a first layer D-1 and a second layer D-2, which is disposed on the first layer D-1. The first layer D-1 may be formed by the same fabrication process (including a photolithography step and a developing step) as the third insulating layer 30, and the second layer D-2 may be formed by the same fabrication process (including a photolithography step and a developing step) as the pixel definition layer PDL.

A sub-dam line DM-S may be further provided outside the dam line DM (e.g., in the left portion of FIG. 2B). The first and second encapsulation inorganic layers IOL1 and IOL2 of the first encapsulation layer TFE1 may be overlapped with the dam line DM. The first and second encapsulation inorganic layers IOL1 and IOL2 of the first encapsulation layer TFE1 may be disposed inside the sub-dam line DM-S. In other words, the first and second encapsulation inorganic layers IOL1 and IOL2 of the first encapsulation layer TFE1 may not extend beyond the sub-dam line DM-S.

The partition wall BW may also be overlapped with the peripheral region NPXA and the non-display region NDA. The partition wall BW may be overlapped with the dam line DM and the sub-dam line DM-S. A dummy opening OP-D, which is overlapped with the non-display region NDA, may be provided in the partition wall BW. FIG. 2B illustrates an example in which two dummy openings OP-D are disposed at the left side of the outermost one of the second openings OP2 in the display region DA.

A dummy control pattern CCF-D may be disposed in the dummy opening OP-D. Since the dummy control pattern CCF-D fills the dummy opening OP-D, a difference in height between the partition wall BW and a region corresponding to the dummy opening OP-D may be reduced. A difference in height between the partition wall BW and the dummy control pattern CCF-D may be controlled to have substantially the same value as that between the partition wall BW and the light control pattern CCF-R. In other words, the top of the dummy control pattern CCF-D may be lower than a top of the partition wall BW. The dummy control pattern CCF-D may be formed by the same process as that for the light control pattern CCF-R and, in this case, it may be formed of the same material as the light control pattern CCF-R.

When the height difference between the partition wall BW and the dummy control pattern CCF-D is larger than a reference value (e.g., when the dummy control pattern CCF-D is not provided in the dummy opening OP-D), the second encapsulation layer TFE2 may not be normally formed in the dummy opening OP-D. In a subsequent process of forming a photosensitive organic material for the color filter CF-R or the protection layer OC in the dummy opening OP-D, the photosensitive organic material may be insufficiently cured, and in this case, a failure, such as an out-gassing phenomenon, may occur. To prevent this from happening, the dummy control pattern CCF-D may be disposed in the dummy opening OP-D.

The dummy opening OP-D may be overlapped with the pixel definition layer PDL. In this case, it is possible to control a depth of the dummy opening OP-D to a value similar to the depth of the second opening OP2. If the dummy opening OP-D is not overlapped with the pixel definition layer PDL, the dummy opening OP-D may be formed to have a depth that is larger than a reference value, and in this case, a difference in height between the dummy control pattern CCF-D and the partition wall BW may not be controlled. The partition wall BW and the dummy control pattern CCF-D may be formed to have a height difference that is larger than that between the partition wall BW and the light control pattern CCF-R. In this case, the partition wall BW and the dummy control pattern CCF-D may be formed to have a height difference larger than the reference value. In such a case, the afore-stated failure may be likely to occur.

The first encapsulation inorganic layer IOL10 of second encapsulation layer TFE2 may be disposed on the partition wall BW, the light control pattern CCF-R, and the dummy control pattern CCF-D. The difference in height between the underlying patterns may be transcribed to the first encapsulation inorganic layer IOL10. This is because the first encapsulation inorganic layer IOL10 is formed by a deposition process. A first step, which is substantially the same as a step formed by the partition wall BW and the light control pattern CCF-R and a second step, which is substantially the same as a step formed by the partition wall BW and the dummy control pattern CCF-D, may be formed on a top surface of the first encapsulation inorganic layer IOL10. The first and second steps may be adjacent to each other.

An edge of the encapsulation organic layer OL-1 of the second encapsulation layer TFE2 may be overlapped with the dummy opening OP-D (e.g., the dummy control pattern CCF-D). Due to the step formed by the partition wall BW and the dummy control pattern CCF-D, when a liquid composite OL-P is used in a process of forming the encapsulation organic layer OL-1, it is possible to delimit a region occupied by the liquid composite OL-P or thereby to prevent the encapsulation organic layer OL-1 from being formed in a region beyond the base substrate BS. The left curved dash line depicted in FIG. 2C illustrates a profile of the liquid composite OL-P, which may be outwardly overflowed when the dummy opening OP-D is omitted. For example, if the dummy opening OP-D is omitted, the liquid composite OL-P may overflow to an area beyond the leftmost dummy opening OP-D in FIG. 2C.

The dummy opening OP-D and the dummy control pattern CCF-D may serve as a stopper for stopping the liquid composite OL-P from outwardly flowing. Since the structure serving as the stopper is formed without an additional process, it is possible to realize a highly reliable display panel without an increase in fabrication cost. In other words, the liquid composite OL-P forming the encapsulation organic layer OL-1 of the second encapsulation layer TFE2 may end at the dummy opening OP-D. In this case, the encapsulation organic layer OL-1 may extend from the display region DA to the dummy opening OP-D closest to the dam line DM in the non-display region NDA. In the alternative, the encapsulation organic layer OL-1 may end at the dummy opening OP-D closest to the second opening OP2.

The right curved dash line in FIG. 2C illustrates a profile of the liquid composite OL-P in which the outward flow of the liquid composite OL-P is stopped by a step formed by the partition wall BW and the outermost light control pattern CCF-R, when the dummy opening OP-D is omitted. In the case where the encapsulation organic layer OL-1 is formed as depicted by the right dash line, the color filter CF-R, which is overlapped with the outermost one of the second openings OP2, may not have a uniform thickness. A small amount of the liquid composite OL-P is provided to prevent defects such as the left dash line of FIG. 2C. But this may cause another defect such as the right dash line of FIG. 2C.

Although, in FIG. 2C, the first encapsulation inorganic layer IOL10 of the second encapsulation layer TFE2 is illustrated to have a single-layered structure, the first encapsulation inorganic layer IOL10 may have a multi-layered structure. The first encapsulation inorganic layer IOL10 may include a silicon oxynitride layer and a silicon oxide layer thereon.

To hermetically seal the light control pattern CCF-R from external moisture, a silicon oxynitride layer, which has high moisture-prevention efficiency, may be used to directly cover the light control pattern CCF-R. A silicon oxynitride layer, which is formed by a low temperature deposition process, may have a layer density higher than a silicon oxide layer and may exhibit a high coupling strength to an underlying layer.

The liquid composite may be provided onto a center region of the display region DA (e.g., see FIG. 1A) in the form of droplet, and in this case, it may be necessary to supply the liquid composite to the non-display region NDA. The liquid composite may flow smoothly toward the non-display region NDA while filling the uneven region, which is formed by a difference in height between the second opening OP2 and the light control pattern CCF-R.

To guide the flow of the liquid composite in such a way to easily fill the underlying uneven region with the liquid composite, the first encapsulation inorganic layer IOL10 may include a silicon oxide layer. Since the silicon oxide layer is relatively hydrophilic compared with silicon oxynitride layer, the silicon oxide layer may improve the fluidity of the liquid composite.

The second encapsulation inorganic layer IOL20 of the second encapsulation layer TFE2 may be disposed on a top surface BW-US of the partition wall BW to be in contact with the first encapsulation inorganic layer IOL10 of the second encapsulation layer TFE2. For example, on the top surface BW-US of the partition wall BW that overlaps the dam line DM, the first and second encapsulation inorganic layers IOL10 and IOL20 may be in direct contact with each other. The second encapsulation inorganic layer IOL20 may hermetically seal the encapsulation organic layer OL-1 thereunder, and thus, the light control pattern CCF-R may be further hermetically sealed by the second encapsulation inorganic layer IOL20.

At least one of the first and second encapsulation inorganic layers IOL10 and IOL20 may be disposed on a side surface BW-SS of the partition wall BW. Such an encapsulation inorganic layer may hermetically seal the partition wall BW.

At least one of the first and second encapsulation inorganic layers IOL0 and IOL20 may be in contact with an inorganic layer of the circuit element layer DP-CL. As shown in FIG. 2B, the partition wall BW may be hermetically sealed by the inorganic layers (e.g., the second insulating layer 20 and one of the encapsulation inorganic layers IOL10 and IOL20). In this case, it is possible to prevent the partition wall BW from being damaged by a wet process of forming the color filter CF-R and the protection layer OC.

As shown in FIG. 2B, two or more color filters CF-R and CF-B in the non-display region NDA may be disposed on the second encapsulation layer TFE2. The two color filters CF-R and CF-B stacked may serve as a light-blocking pattern.

An embodiment of the inventive concept provides a display panel DP including: a display region DA including pixels PX and a non-display region NDA adjacent to the display region DA, wherein each pixel PX includes an emission element OLED, each of the emission elements including a first electrode AE, an emission layer EML disposed on the first electrode AE, and a second electrode CE disposed on the emission layer EML; a pixel definition layer PDL including a first opening OP1 that exposes the first electrode AE of each of the emission elements OLED; a first encapsulation layer TFE1 disposed on the pixel definition layer PDL and overlapping the emission elements OLED; a partition wall BW disposed on the first encapsulation layer TFE1 and including a second opening OP2 corresponding to the first opening OP1 and a dummy opening OP-D overlapping the non-display region NDA; a light control pattern CCF-R disposed in the second opening OP2; a second encapsulation layer TFE2 disposed on the partition wall BW and overlapping the light control pattern CCF-R; and a color filter CF-R disposed on the second encapsulation layer TFE2 and overlapping the light control pattern CCF-R, wherein the second encapsulation layer TFE2 includes: a first encapsulation inorganic layer IOL10 disposed on the partition wall BW; an encapsulation organic layer OL-1 disposed on the first encapsulation inorganic layer IOL10 and including an edge overlapping the dummy opening OP-D; and a second encapsulation inorganic layer IOL20 disposed on the encapsulation organic layer OL-1.

Figure 3A:
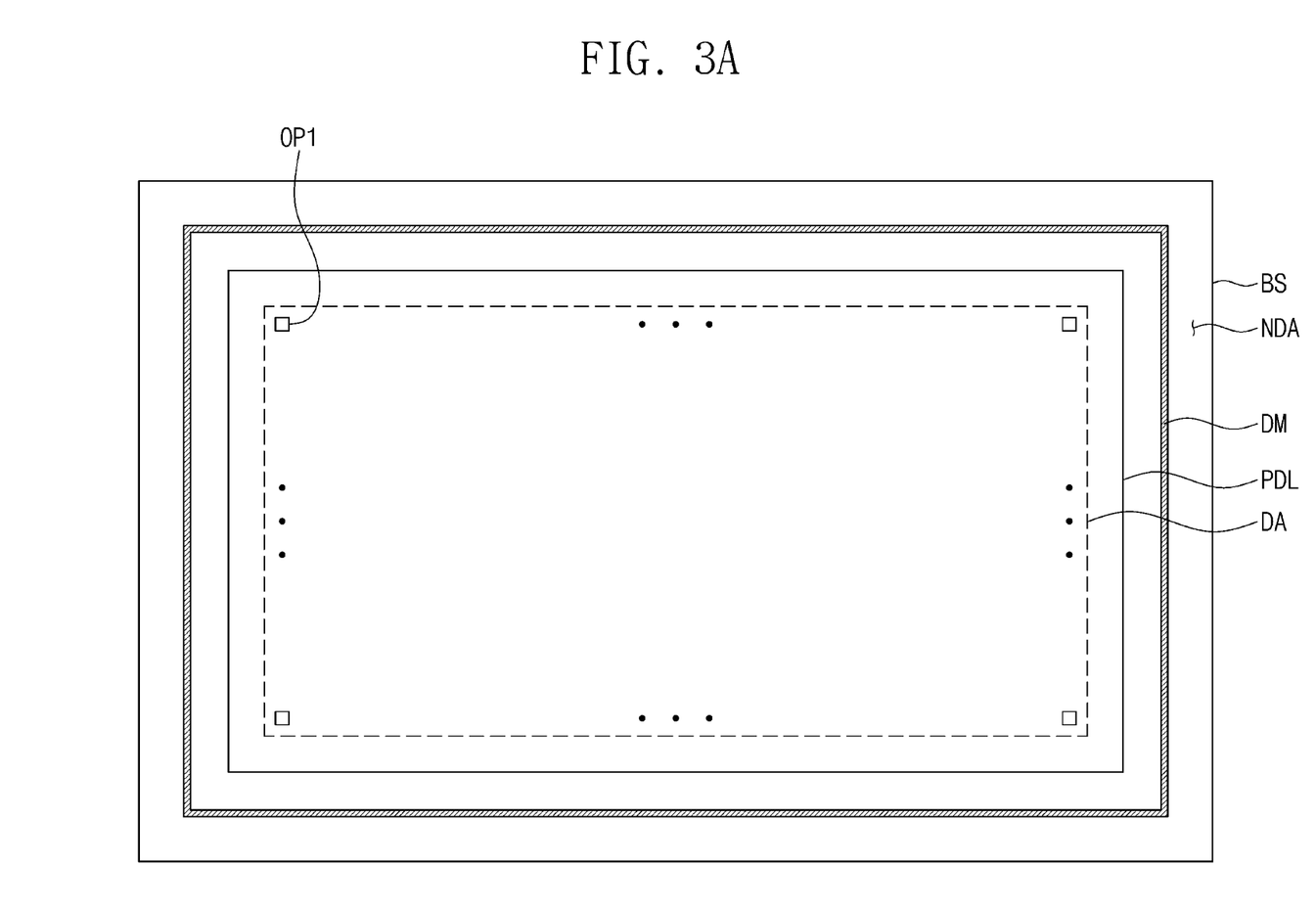
FIG. 3A is a plan view illustrating a display panel according to an embodiment of the inventive concept.
Figure 3B:
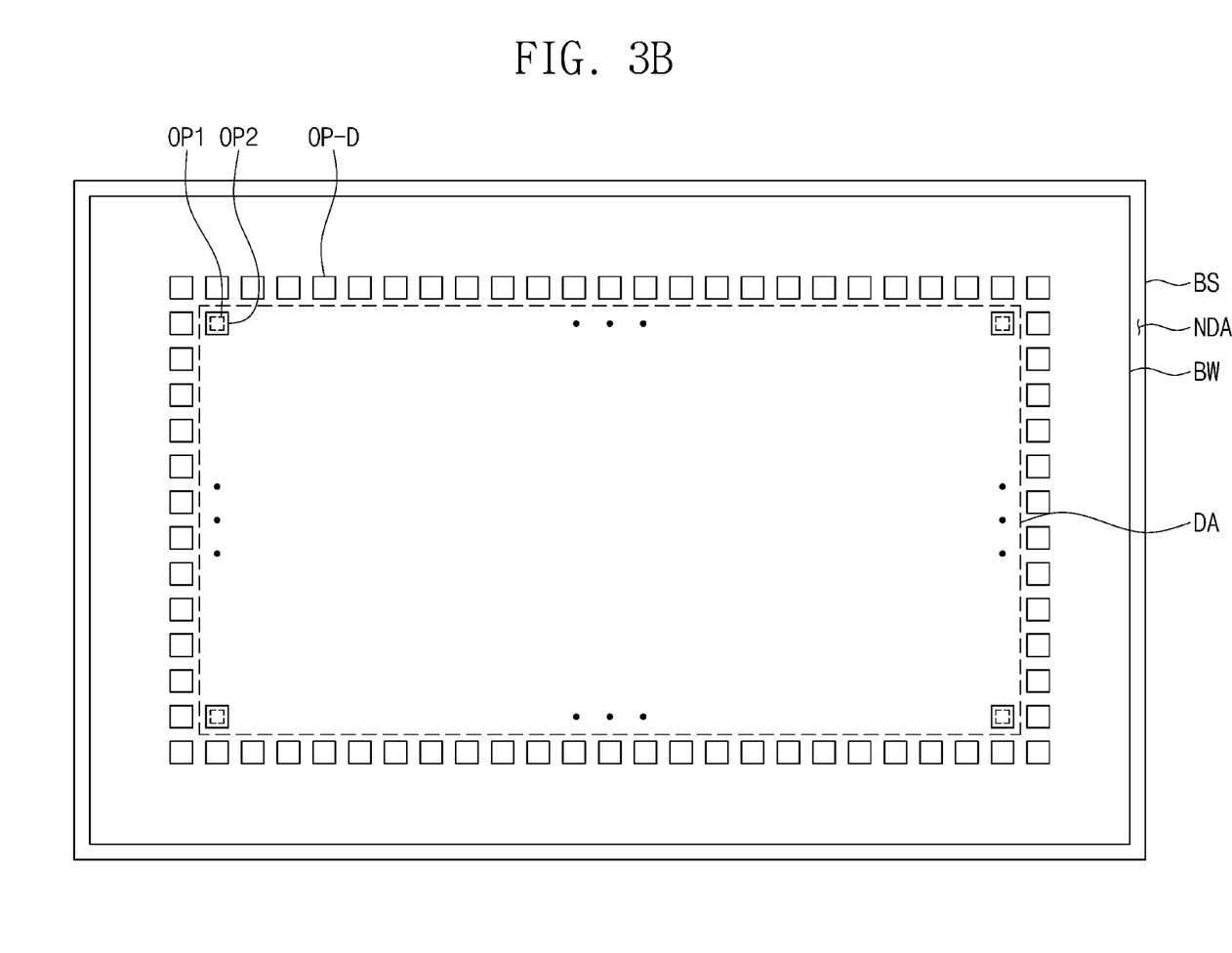
FIG. 3B is a plan view illustrating a display panel according to an embodiment of the inventive concept.
Figure 4A:
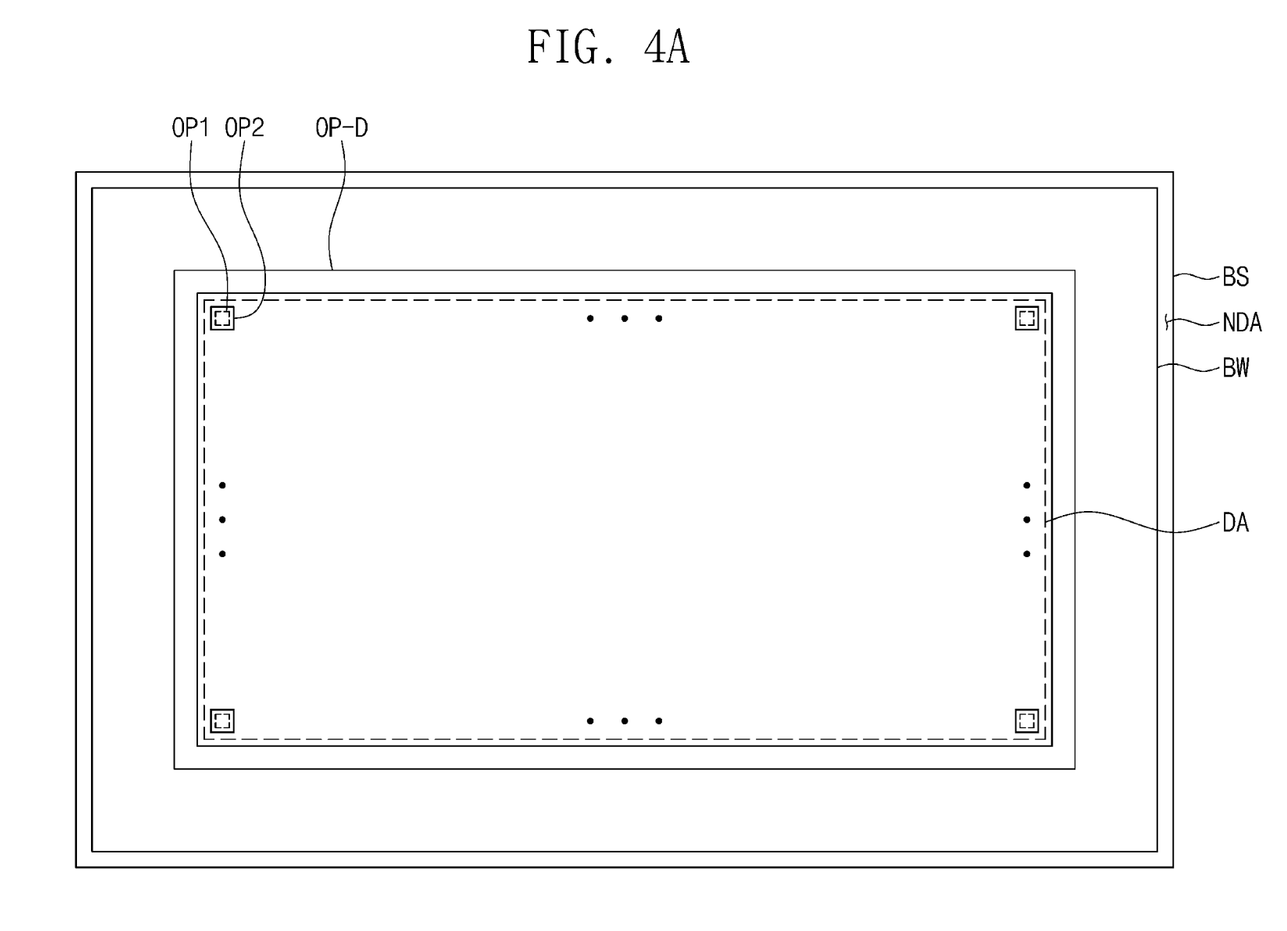
FIG. 4A is a plan view illustrating a display panel according to an embodiment of the inventive concept.
Figure 4B:
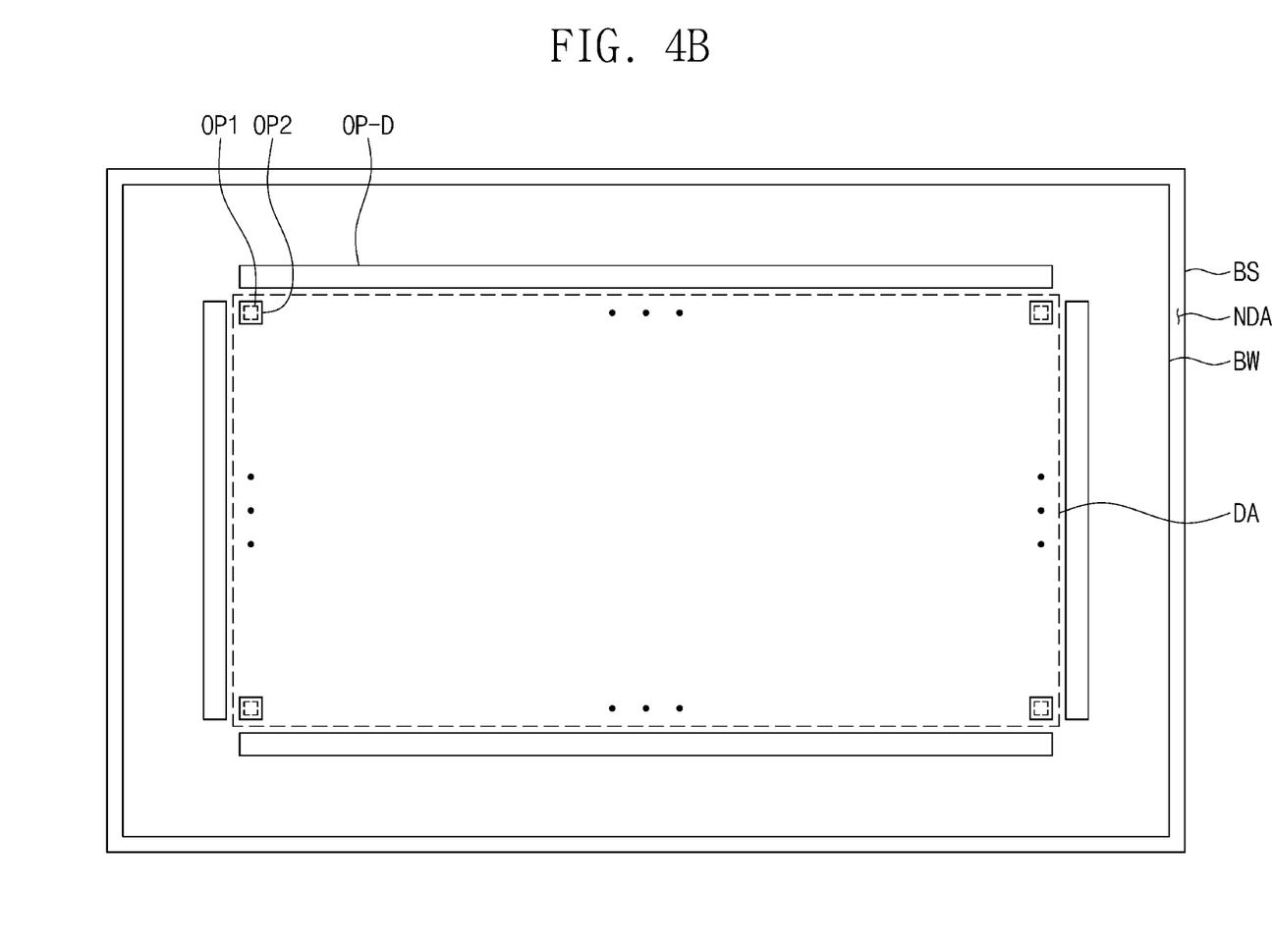
FIG. 4B is a plan view illustrating a display panel according to an embodiment of the inventive concept.

FIG. 3A is a plan view illustrating the display panel DP according to an embodiment of the inventive concept. FIG. 3B is a plan view illustrating the display panel DP according to an embodiment of the inventive concept. FIG. 4A is a plan view illustrating the display panel DP according to an embodiment of the inventive concept. FIG. 4B is a plan view illustrating the display panel DP according to an embodiment of the inventive concept. For concise description, an element previously described with reference to FIGS. 1A to 2B may be identified by the same reference number without repeating an overlapping description thereof.

Referring to FIG. 3A, the pixel definition layer PDL may be overlapped with the display region DA and may be partially overlapped with the non-display region NDA, when viewed in a plan view. An edge of the pixel definition layer PDL may be disposed outside the display region DA. The first opening OP1 may be disposed in each of the pixels PX shown in FIG. 1A. FIG. 3A illustrates an example, in which one dam line DM is provided to be spaced apart from the edge of the pixel definition layer PDL. The dam line DM may have a closed-line shape, when viewed in a plan view. The dam line DM may be located between an edge of the pixel definition layer PDL and an edge of the base substrate BS.

Referring to FIG. 3B, the partition wall BW may be overlapped with the display region DA and may be partially overlapped with the non-display region NDA, when viewed in a plan view. An edge of the partition wall BW may be disposed outside the edge of the pixel definition layer PDL shown in FIG. 3A. The second opening OP2 may be disposed in each of the first openings OP1 of FIG. 3A.

The dummy opening OP-D may have the same area as the second opening OP2, when viewed in a plan view. In an embodiment, the dummy opening OP-D may be formed under the same condition as that for the second opening OP2. For example, in the case where an existing mask is slightly modified, the dummy opening OP-D and the second opening OP2 may be formed through the same process without any additional mask.

FIG. 3B illustrates an example in which the dummy openings OP-D are arranged outside the display region DA to form a single group enclosing the display region DA. As shown in FIG. 2B, the dummy openings OP-D may be arranged to form a pair of groups, each of which encloses the display region DA. In an embodiment, the dummy openings OP-D may be formed on less than all sides of the display region DA.

As shown in FIGS. 4A and 4B, the dummy opening OP-D may be different from the second opening OP2 in terms of area and shape, when viewed in a plan view. As shown in FIG. 4A, the dummy opening OP-D may have a closed-line shape continuously enclosing the display region DA. As shown in FIG. 4B, the dummy opening OP-D may include four regions that are provided to face four different edges of the display region DA. In this case, spaces may be provided between adjacent ones of the four regions of the dummy opening OP-D.

According to an embodiment of the inventive concept, it is possible to reduce the number of masks that are required to fabricate a display panel and to form a color filter with a uniform thickness. Thus, it is possible to increase a display quality of the display panel, without an increase of fabrication cost.

In addition, a second encapsulation layer may be disposed to hermetically seal or encapsulate a partition wall, and in this case, it is possible to reduce a delamination or loosing failure in the partition wall.

Furthermore, a light-blocking structure may be formed using a color filter.

While example embodiments of the inventive concept have been particularly shown and described, it will be understood by one of ordinary skill in the art that variations in form and detail may be made thereto without departing from the spirit and scope of the inventive concept as set forth in the attached claims.

What is claimed is:

1. A display panel, comprising:
   a display region including pixels and a non-display region adjacent to the display region, wherein each pixel includes an emission element, the emission element comprising a first electrode, an emission layer disposed on the first electrode, and a second electrode disposed on the emission layer;
   a pixel definition layer including a first opening that exposes the first electrode of the emission element;
   a first encapsulation layer disposed on the pixel definition layer and overlapping the emission element;
   a partition wall disposed on the first encapsulation layer and including a second opening corresponding to the first opening and a dummy opening overlapping the non-display region;
   a light control pattern disposed in the second opening;
   a second encapsulation layer disposed on the partition wall and overlapping the light control pattern; and
   a color filter disposed on the second encapsulation layer and overlapping the light control pattern,
   wherein the second encapsulation layer comprises:
   a first encapsulation inorganic layer disposed on the partition wall;
   an encapsulation organic layer disposed on the first encapsulation inorganic layer and including an edge overlapping the dummy opening; and
   a second encapsulation inorganic layer disposed on the encapsulation organic layer.

2. The display panel of claim 1, further comprising a dummy control pattern disposed in the dummy opening.

3. The display panel of claim 2, wherein the dummy control pattern comprises the same material as the light control pattern.

4. The display panel of claim 1, wherein the light control pattern comprises a quantum dot.

5. The display panel of claim 1, wherein the emission element comprises a first emission element, a second emission element, and a third emission element for generating a source light, and
   the emission layer of the first emission element, the emission layer of the second emission element, and the emission layer of the third emission element are in the form of a single body.

6. The display panel of claim 1, wherein the partition wall overlaps the display region and the non-display region, and
   the first and second encapsulation inorganic layers are disposed on a top surface of the partition wall in the non-display region.

7. The display panel of claim 6, wherein at least one of the first and second encapsulation inorganic layers is disposed on a side surface of the partition wall in the non-display region.

8. The display panel of claim 7, further comprising an inorganic layer disposed below the emission element, wherein the at least one of the first and second encapsulation inorganic layers is in contact with the inorganic layer in the non-display region.

9. The display panel of claim 1, wherein the second opening and the dummy opening have substantially the same area.

10. The display panel of claim 1, wherein the dummy opening is provided in plural, and
    the plurality of dummy openings enclose the display region when viewed in a plan view.

11. The display panel of claim 1, wherein a difference in height between a top surface of the partition wall and a top surface of the light control pattern is about 2 μm to about 3 μm.

12. The display panel of claim 1, wherein the emission element comprises a first emission element, a second emission element, and a third emission element for generating a source light,
    the light control pattern comprises a first color conversion pattern for converting the source light to a first color light, a second color conversion pattern for converting the source light to a second color light, and a transmission pattern transparent to the source light,
    the color filter comprises a first color filter corresponding to the first color conversion pattern, a second color filter corresponding to the second color conversion pattern, and a third color filter corresponding to the transmission pattern, and
    at least two of the first color filter, the second color filter, and the third color filter are disposed on the second encapsulation layer and in the non-display region.

13. The display panel of claim 1, wherein the dummy opening overlaps the pixel definition layer.

14. The display panel of claim 1, further comprising a dam line, which is disposed away from the pixel definition layer and overlaps the non-display region when viewed in a plan view,
    wherein the first encapsulation layer comprises:
    a first encapsulation inorganic layer overlapping the dam line;
    an encapsulation organic layer disposed on the first encapsulation inorganic layer of the first encapsulation layer and including an edge disposed inside the dam line; and
    a second encapsulation inorganic layer disposed on the encapsulation organic layer of the first encapsulation layer and overlapping the dam line.

15. The display panel of claim 14, wherein the dam line has a closed-line shape when viewed in a plan view.

16. The display panel of claim 1, further comprising a protection layer overlapping the display region and the non-display region and disposed on the color filter.

17. The display panel of claim 1, wherein the first encapsulation inorganic layer comprises a silicon oxynitride layer and a silicon oxide layer disposed on the silicon oxynitride layer.

18. A display panel, comprising:
    a display region including pixels and a non-display region adjacent to the display region, wherein each of the pixels includes an emission element, wherein the emission element includes a first electrode, an emission layer disposed on the first electrode, and a second electrode disposed on the emission layer;
    an inorganic layer overlapping the display region and the non-display region;
    a pixel definition layer including a first opening that exposes the first electrode of the emission element;

a first encapsulation layer disposed on the pixel definition layer and overlapping the emission element;

a partition wall disposed on the first encapsulation layer and including a second opening corresponding to the first opening;

a light control pattern disposed in the second opening;

a second encapsulation layer disposed on the partition wall and overlapping the light control pattern; and a color filter disposed on the second encapsulation layer and overlapping the light control pattern, wherein the second encapsulation layer comprises:

a first encapsulation inorganic layer disposed on the partition wall;

an encapsulation organic layer disposed on the first encapsulation inorganic layer; and a second encapsulation inorganic layer disposed on the encapsulation organic layer, wherein at least one of the first and second encapsulation inorganic layers is disposed in the non-display region and on a top surface and a side surface of the partition wall.

19. The display panel of claim 18, wherein the at least one of the first and second encapsulation inorganic layers is in contact with the inorganic layer in the non-display region.

20. The display panel of claim 18, wherein the emission element comprises a first emission element, a second emission element, and a third emission element for generating a source light, the light control pattern comprises a first color conversion pattern for converting the source light to a first color light, a second color conversion pattern for converting the source light to a second color light, and a transmission pattern transparent to the source light, the color filter comprises a first color filter corresponding to the first color conversion pattern, a second color filter corresponding to the second color conversion pattern, and a third color filter corresponding to the transmission pattern, and at least two of the first color filter, the second color filter, and the third color filter are disposed in the non-display region and on the second encapsulation layer.

21. A display panel, comprising:

a display region including emission elements and a non-display region adjacent to the display region;

a pixel definition layer including a first opening;

a first encapsulation layer disposed on the pixel definition layer and overlapping the emission elements;

a partition wall disposed on the first encapsulation layer and including a second opening overlapping the first opening and first and second dummy openings overlapping the pixel definition layer in the non-display region;

a light control pattern disposed in the second opening; and a second encapsulation layer disposed on the partition wall and overlapping the light control pattern and the first and second dummy openings, wherein the second encapsulation layer comprises:

an organic layer ending at the second dummy opening.

22. The display panel of claim 21, further comprising a dummy control pattern provided in each of the first and second dummy openings.

23. The display panel of claim 21, wherein the second encapsulation layer further comprises first and second inorganic layers extending beyond the second dummy opening to overlap a portion of the partition wall covering a dam.

* * * * *